United States Patent [19]

Ito

[11] Patent Number: 5,155,063
[45] Date of Patent: Oct. 13, 1992

[54] METHOD OF FABRICATING SEMICONDUCTOR DEVICE INCLUDING AN AL/TIN/TI CONTACT

[75] Inventor: Nobukazu Ito, Tokyo, Japan
[73] Assignee: NEC Corporation, Tokyo, Japan
[21] Appl. No.: 773,420
[22] Filed: Oct. 9, 1991

[30] Foreign Application Priority Data

Oct. 9, 1990 [JP] Japan .................... 2-271042

[51] Int. Cl.$^5$ ........................... H01L 21/283
[52] U.S. Cl. ..................... 437/190; 437/192; 204/298.12; 148/DIG. 158
[58] Field of Search ............ 437/190, 192, 195; 204/192.12, 192.13, 298.13, 298.12; 357/67, 71; 148/DIG. 158

[56] References Cited

U.S. PATENT DOCUMENTS

| | | | |
|---|---|---|---|
| 4,619,695 | 10/1986 | Oikawa et al. | 75/65 EB |
| 4,731,116 | 3/1988 | Kny | 75/238 |
| 4,829,024 | 5/1989 | Klein et al. | 437/189 |
| 4,882,293 | 11/1989 | Naumann et al. | 437/52 |
| 4,897,709 | 1/1990 | Yokoyama et al. | 357/68 |
| 4,911,809 | 3/1990 | Wort et al. | 204/298.04 |
| 4,960,732 | 10/1990 | Dixit et al. | 437/192 |

FOREIGN PATENT DOCUMENTS

| | | |
|---|---|---|
| 0310108 | 4/1989 | European Pat. Off. . |
| 2443926 | 7/1980 | France . |
| 58-101454 | 6/1983 | Japan . |
| 62-284069 | 12/1987 | Japan . |
| 63-161163 | 7/1988 | Japan . |
| 63-111666 | 8/1988 | Japan . |
| 02-015167 | 1/1990 | Japan . |

OTHER PUBLICATIONS

Maeda et al, "TiN/Ti barrier metal . . . induced damage analysis", Proceedings 3rd Int'l. IEEE VLSI Multilevel Interconnection Conf., Jun. 9, 1988, Santa Clara, Calif., pp. 411–417.
Joswig, et al., "Improved Performance of TiN–diffusion barriers after a post treatment", Jun. 12–13, 1990 VMIC Conference, p. 477.

Primary Examiner—T. N. Quach
Attorney, Agent, or Firm—Sughrue, Mion, Zinn Macpeak & Seas

[57] ABSTRACT

The present invention relates to a method of fabricating a semiconductor device, which comprises a formation of contact holes in an interlayer insulating film formed on a silicon substrate, formation of a titanium film and a titanium nitride film, as a barrier metal, and lamp annealing. The formation of the titanium nitride film is featured by reactive sputtering using a titanium target whose orientation ratio of (001) plane is not more than 70%. The titanium nitride film thus formed does not shrink rapidly during heat treatment and thus degradation of barrier performance thereof is prevented.

5 Claims, 2 Drawing Sheets

METHOD OF FABRICATING SEMICONDUCTOR DEVICE INCLUDING AN AL/TIN/TI CONTACT

BACKGROUND OF THE INVENTION

1. Field of the Invention

The present invention relates to a method of fabricating a semiconductor device and, particularly, to a method of forming an electrode wiring on a silicon substrate through a barrier metal.

2. Description of the Prior Art

Heretofore, aluminum (Al) or an alloy thereof has been mainly used as material for forming electrode wirings which are in ohmic contact with respective impurity diffusion regions formed in a silicon (Si) substrate and further with the silicon substrate itself. As well known in the art, if such a metal for electrode wiring is directly formed on the silicon substrate, an alloy spike and/or silicon nodule may be produced by reaction between aluminum and silicon due to thermal hysteresis of the metal deposition step and subsequent steps. In a case of a single layer wiring of aluminum or its alloy, breakage of wiring due to electromigration and/or stressmigration becomes a severe problem. In order to prevent aluminum and silicon in contact regions from reacting with each other, it is usual to form a barrier metal layer between the silicon substrate and the metal layer forming the electrode wiring. A multilayer wiring using such barrier metal layer is effective in preventing such wiring breakage due to electromigration or stressmigration.

The barrier metal layer is generally formed only on the contact regions of the impurity diffusion regions to the electrodes. In order to improve the durability against stressmigration, however, it is popular recently that the barrier metal layer is formed not only on the contact regions but also on a wiring formation regions beneath the electrode wirings. The latter scheme is becoming popular. As the barrier metal to be formed beneath the electrode wiring, a titanium (Ti) film or a titanium nitride (TiN) film is mainly used.

More specifically, an interlayer insulating film of such as silicon dioxide is formed on a silicon substrate in which desired diffusion regions are formed through desired impurity diffusion steps. After a contact hole is formed in the interlayer insulating film, a titanium (Ti) film and a titanium nitride (TiN) film are formed sequentially on the surface of the silicon substrate as a barrier metal, followed by carrying out heat treatment. An aluminum (Al) film is thereafter formed on the barrier metal layer, and these three metal layers are then patterned to form a three-layer electrode wiring.

The titanium nitride film as the barrier metal is usually formed by reactive sputtering with using titanium as a target electrode in a mixture gas of argon (Ar) and nitrogen gas ($N_2$) as sputtering atmosphere. The subsequent heat treatment is performed by lamp annealing within nitrogen gas or $NH_3$ gas. By this heat treatment, the titanium film within the contact hole is silicided from the side of the silicon substrate while non-reacted titanium of the titanium nitride film and the titanium film are nitrided from the side of the sputtering gas. Therefore, the performance of the titanium film and the titanium nitride film as the barrier metal is improved and the contact resistance is reduced. This heat treatment was reported by H. Joswig and W. Pamler in Jun. 12-13, 1990, VMIC Conference.

However, in the fabrication method of semiconductor device, mentioned above, when the titanium nitride film is lamp-annealed to improve the properties thereof, it is crystallized by rapid heating and shrinked, resulting in fine cracks in the titanium nitride film. Therefore, the barrier performance of the titanium nitride film is degraded and leakage current is increased, resulting in degradation of reliability of the semiconductor device.

BRIEF SUMMARY OF THE INVENTION

Object of the Invention

An object of the present invention is to provide a method of fabricating semiconductor device, by which formation of fine cracks in a titanium nitride film during lamp-annealing is restricted and the reliability of resultant semiconductor device is improved.

SUMMARY OF THE INVENTION

In a method for fabricating a semiconductor device through formation of contact holes in an interlayer insulating film formed on a silicon substrate, formations of a titanium film and a titanium nitride film on a whose surface of the substrate and heat-treatment thereof by means of lamp annealing, the present invention resides in that the titanium nitride film is formed by reactive sputtering with using a titanium target whose ratio of (001) plane among orientations existing a surface thereof, that is, orientation ratio, is not more than 70%.

The present inventors have found that, with the titanium target whose orientation ratio of (001) plane is not more than 70%, the deposition rate of the titanium nitride film is reduced and residual oxygen in atmosphere is taken in the titanium nitride film thus formed. The titanium nitride film containing such large amount of oxygen does not rapidly shrink by lamp annealing. Since, therefore, the formation of fine cracks in the titanium nitride film is restricted, the degradation of barrier performance is avoided. The present invention is based on this discovery.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

The present invention will be described with reference to an embodiment thereof in conjunction with the drawings.

Figure 1:
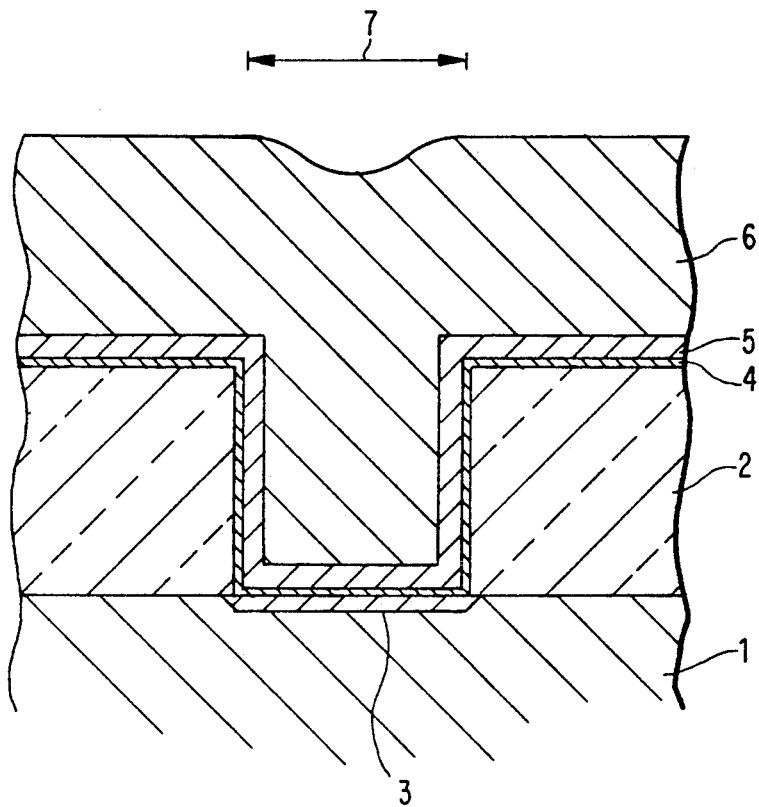
FIG. 1 is a cross section of a semiconductor chip for explaining a first embodiment of the present invention.

Referring to FIG. 1 which is a cross section of a semiconductor chip according to a first embodiment of the present invention, an interlayer insulating film 2 of such as silicon dioxide ($SiO_2$) or PSG is formed on a silicon substrate 1 and then a contact hole 7 is formed by patterning the interlayer insulating film 2 thus formed. Then, an impurity diffusion layer 3 is formed in a portion of the silicon substrate 1 corresponding to the contact hole 7 by introducing an impurity thereto. Thereafter, a titanium film 4 having thickness of 20 to 80 nm is deposited thereon by sputtering. The above-mentioned steps are the same as those used in the conventional fabrication method.

Thereafter, a titanium nitride film 5 having thickness of 80 to 150 nm is deposited thereon by means of reactive sputtering using titanium as a target. The titanium target to be used in this sputtering is preliminarily regulated such that its orientation ratio of the surface area of a (001) plane relative to the surface area of all the planes of the target surface is about 50%. The sputtering conditions are a mixture gas of argon (Ar) and nitrogen gas as sputtering atmosphere, total gas pressure of 4 mm Torr, power of 3 kW and substrate temperature of 200° C. Thereafter, a heat treatment is performed by a lamp annealing in nitriding atmosphere such as nitrogen gas or NH$_3$ gas at 500 to 900° C. for 30 seconds. Then, an aluminum film 6 is formed thereon and an electrode wiring having three-layer structure is formed by patterning the aluminum film 6, the titanium nitride film 5 and the titanium film 4, all together.

A method of fabricating the titanium target will be described with reference to FIGS. 2 and 3.

Figure 2:
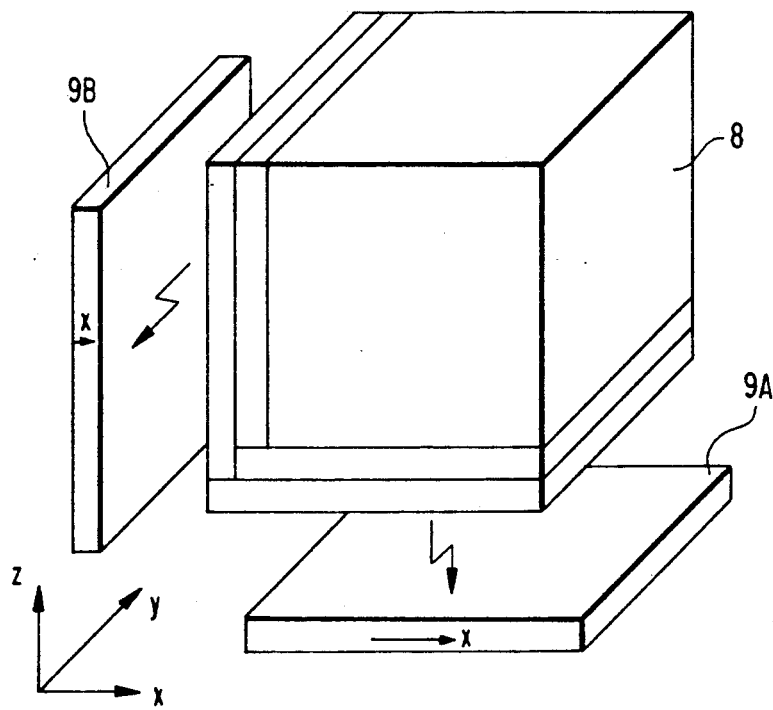
FIG. 2 is a perspective view of a bulk material for explaining a cutting method of a titanium target plate to be used in the first embodiment.
Figure 3:
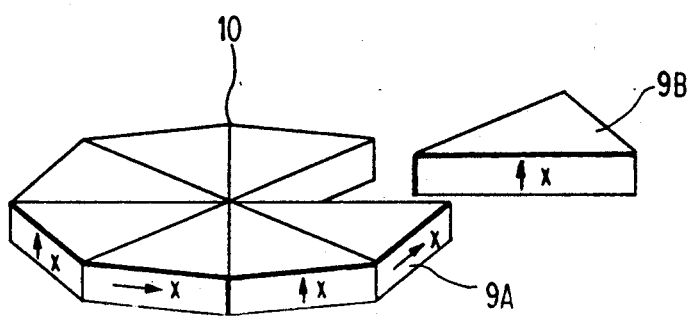
FIG. 3 shows a construction of the titanium target to be used in the first embodiment.

Referring to FIG. 2, the (001) plane orientation ratio in a surface of a bulk titanium material 8 for ordinary titanium target was measured such as by X ray diffraction. Then, for example, titanium target plates 9A each having minimum orientation ratio were cut out parallel to an X-Y plane and titanium target plates 9B each having maximum orientation ratio were cut out parallel to a Y-Z plane. Then, as shown in FIG. 3, these plates 9A and 9B were cut to triangle shape and arranged regularly to obtain a polygonal titanium target plate 10 whose combined (001) plane orientation ratio to all the planes is about 50%.

Similarly, several titanium target plates whose (001) plane orientation ratio to all the planes ranges from 20% to 90% were prepared, and semiconductor devices were fabricated by forming the titanium nitride films from these titanium targets. For these semiconductor devices, the relation between the orientation ratio of (001) plane to all the planes and junction leakage current defect was observed, the result being shown in FIG. 4.

Figure 4:
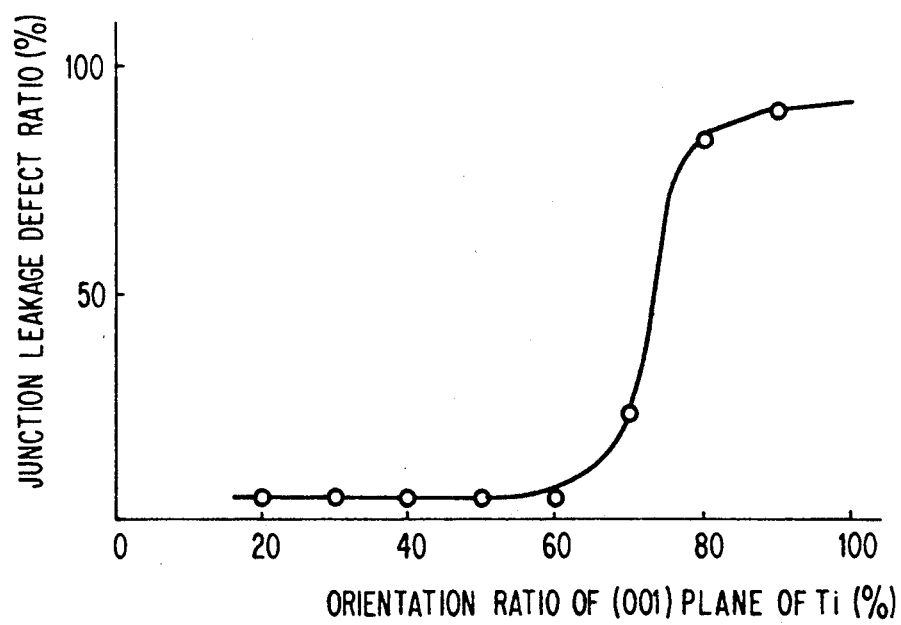
FIG. 4 shows a relation between the orientation ratio of (001) plane of the titanium target and a ratio of junction leakage current defect.

As is clear from FIG. 4, with the titanium target having an orientation ratio of a (001) plane to all the planes of more than 70%, the junction leakage defect increases due to fine cracks formed in the titanium nitride film 4. Therefore, it is necessary that the (001) plane orientation ratio to all the planes of the titanium target is not more than 70%.

A surface of a titanium target in nitriding atmosphere is converted by reaction with nitrogen in plasma into titanium nitride and the latter is sputtered. In this case, when the (001) plane orientation ratio to all the planes of the titanium target surface is high, an amount of titanium nitride sputtered from the surface is increased and deposition rate of titanium nitride film on the silicon substrate is increased. On the contrary, with a smaller such orientation ratio of the titanium target surface, the deposition rate of titanium nitride film is reduced and more residual oxygen in the atmosphere is taken in the titanium nitride film. In such titanium nitride film containing such amount of oxygen, formation of fine cracks is restricted due to the fact that rapid shrinkage of the film is reduced even if it is subjected to a rapid heat treatment by means of lamp annealing. It is believed that, for this reason, the degradation of barrier performance is reduced and junction leakage defect is also reduced.

Although, in the first embodiment, the titanium target plates are cut out from the bulk material after the (001) plane orientation ratio to all the planes thereof is measured, it is possible to produce a titanium target having (001) plane orientation ratio to all the planes of not more than 70%, by cutting target plates from a titanium bulk material parallel to three or more different directions and regularly arranging them. The shape of the titanium target is not limited to octagonal as shown in FIG. 3 and any other polygonal shape or even circular shape may be possible.

A second embodiment of the present invention will be described. Although the step of forming a titanium nitride film by using a titanium target whose (001) plane orientation ratio to all the planes is not more than 70% is the same as in the first embodiment, such orientation ratio in the second embodiment is regulated to be not in excess of 70% by means of annealing.

The titanium target is prepared by cutting and shaping a bulk titanium material. In order to improve a degradation of workability due to work hardening, the titanium bulk material is annealed at 600 to 1600° C. By this annealing, titanium in the bulk material recrystallized and grain growth speed is higher with higher temperature and longer treating time, resulting in higher (001) plane orientation ratio to all the planes of the titanium target surface. Therefore, when a surface of the annealed bulk material is used as a surface of the titanium target, the (001) plane orientation ratio to all the planes of the target may become larger than 70%, causing junction leakage defect to be increased.

In order to make the (001) plane orientation ratio to all the planes smaller than 70% without degradation of workability due to work hardening, the titanium target in the second embodiment was prepared by annealing the bulk material at 1000 to 1600° C. for 5 to 30 minutes. For example, the orientation ratio of (001) plane of the titanium bulk material annealed at 1100° C. for 10 minutes was 30 to 40%.

When a semiconductor device was produced by forming a titanium nitride film with using a titanium target whose (001) plane orientation rate to all the planes is made not to exceed 70% by this annealing, the junction leak defect was as small as in the first embodiment, improving the reliability of the semiconductor device.

Although the present invention has been described with reference to a specific embodiment (or specific embodiments), this description is not meant to be construed in a limiting sense. Various modifications of the disclosed embodiments, as well as other embodiments of the invention, will becomes apparent to persons skilled in the art upon reference to the description of the invention. It is therefore contemplated that the appended claims will cover any modifications or embodiments as fall within the true scope of the invention.

What is claimed is:

1. A method of fabricating a semiconductor device comprising the steps of:

forming at least one contact hole in an insulating film formed on a silicon substrate to expose a part of said silicon substrate;

depositing a titanium film and a titanium nitride film on said insulating film and said part of said silicon substrate;

annealing said silicon substate; and depositing an aluminum film on said titanium nitride film to form an electrode wiring layer having a three-layer structure of said aluminum film, said titanium nitride film and said titanium film;

wherein said titanium nitride film is formed by reactive sputtering using a titanium target having a target surface to be sputtered constituted by a (001) plane and at least one other plane, and an orientation ratio of the surface area of said (001) plane to the total surface area of all the planes constituting said target surface to be sputtered being not more than 70%.

2. The method as claimed in claim 1, wherein said titanium target is constructed by at least first and second titanium plates each having a (001) plane, the (001) plane of said first titanium plate being larger in surface area than that of the (001) plane of said second titanium plate.

3. The method as claimed in claim 2, wherein each of said first and second titanium plates is of triangle shape.

4. The method as claimed in claim 1, wherein said titanium target is constituted by a plurality of first titanium plates and a plurality of second titanium plates, each of said first titanium plates having a first (001) plane orientation ratio to all the planes forming a target surface thereof and each of said second titanium plates having a second (001) plane orientation ratio to all the planes forming a target surface thereof, said first (001) plane orientation ratio being higher than said second (001) plane orientation ratio, and wherein said titanium target is polygonal in shape.

5. The method as claimed in claim 1, wherein said titanium target is annealed.

* * * * *